US010276464B2

(12) United States Patent
Shimizu et al.

(10) Patent No.: US 10,276,464 B2
(45) Date of Patent: Apr. 30, 2019

(54) SEMICONDUCTOR DEVICE

(71) Applicant: Mitsubishi Electric Corporation, Tokyo (JP)

(72) Inventors: Yasutaka Shimizu, Tokyo (JP); Takuya Takahashi, Tokyo (JP); Yoshitaka Otsubo, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/841,353

(22) Filed: Dec. 14, 2017

(65) Prior Publication Data

US 2018/0269120 A1 Sep. 20, 2018

(30) Foreign Application Priority Data

Mar. 16, 2017 (JP) ................. 2017-050871

(51) Int. Cl.
| | |
|---|---|
| H01L 23/14 | (2006.01) |
| H01L 23/31 | (2006.01) |
| H01L 23/043 | (2006.01) |
| H01L 23/24 | (2006.01) |
| H01L 21/54 | (2006.01) |
| H01L 23/367 | (2006.01) |
| H01L 23/373 | (2006.01) |
| H01L 23/433 | (2006.01) |
| H01L 23/053 | (2006.01) |

(52) U.S. Cl.
CPC .......... *H01L 23/142* (2013.01); *H01L 21/54* (2013.01); *H01L 23/043* (2013.01); *H01L 23/24* (2013.01); *H01L 23/3121* (2013.01); *H01L 23/3677* (2013.01); *H01L 23/3736* (2013.01); *H01L 23/4334* (2013.01); *H01L 23/053* (2013.01); *H01L 23/367* (2013.01); *H01L 23/3735* (2013.01)

(58) Field of Classification Search
CPC combination set(s) only.
See application file for complete search history.

(56) References Cited

U.S. PATENT DOCUMENTS

| 6,753,596 B1 | 6/2004 | Nakajima et al. | |
|---|---|---|---|
| 2015/0035138 A1* | 2/2015 | Miyamoto | .............. H01L 23/16 257/712 |
| 2015/0092379 A1* | 4/2015 | Yoshimatsu | ........... H05K 3/284 361/783 |

FOREIGN PATENT DOCUMENTS

JP 2004-186622 A 7/2004

* cited by examiner

*Primary Examiner* — Ratisha Mehta
(74) *Attorney, Agent, or Firm* — Studebaker & Brackett PC

(57) ABSTRACT

Provided is a technique of reducing detachment of a sealing resin in a semiconductor device, thereby achieving an increased improvement in lifetime of the semiconductor device. The semiconductor device includes the following: an insulating substrate; a metal block disposed on the upper surface of the insulating substrate; a semiconductor element mounted on the upper surface of the metal block; a case enclosing the semiconductor element, the metal block, and the insulating substrate; and a sealing resin sealing the semiconductor element and the metal block. The metal block includes at least one groove on a surface of the metal block, the surface being in contact with the sealing resin. The opening of the at least one groove has a width narrower than a width of the bottom surface of the at least one groove.

7 Claims, 7 Drawing Sheets

F I G. 1
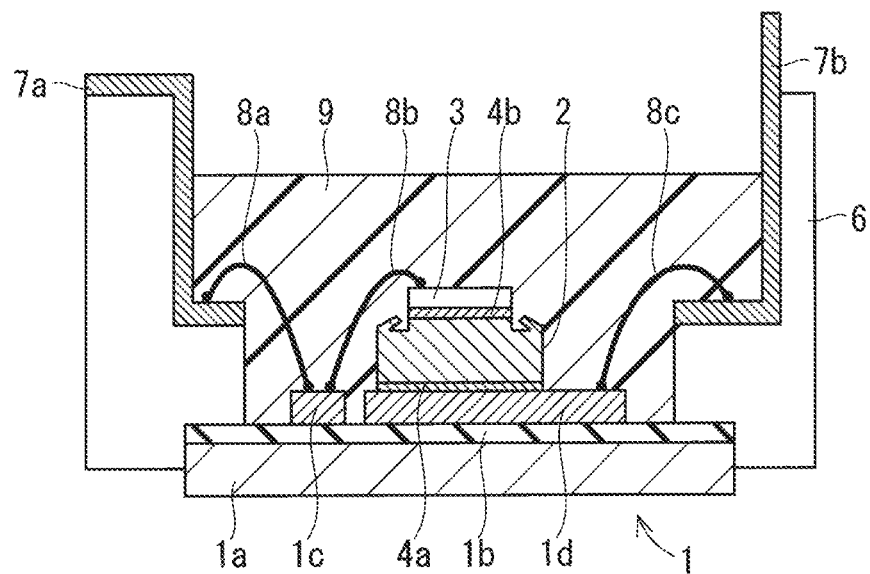
F I G. 2
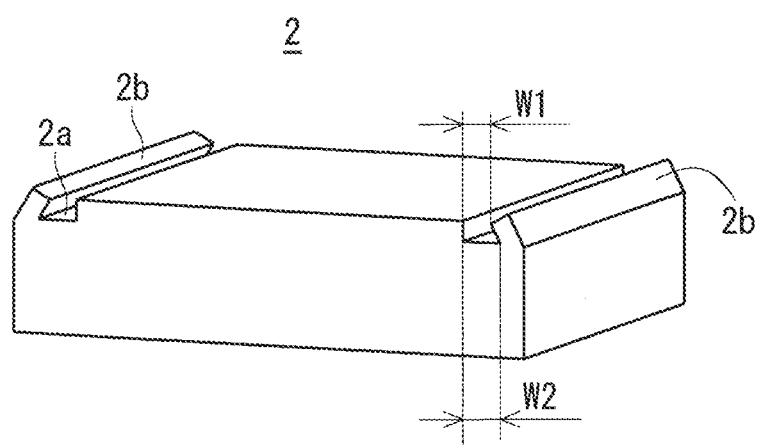

F I G . 3
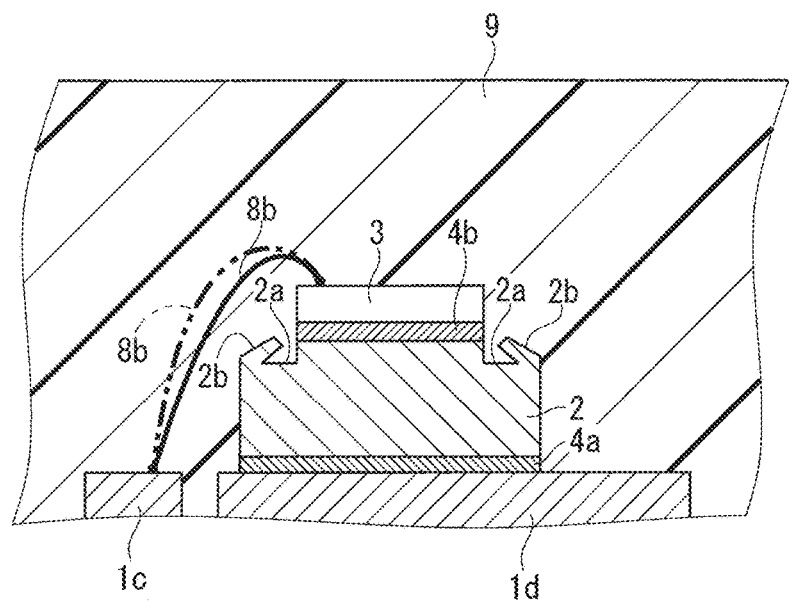
F I G . 4
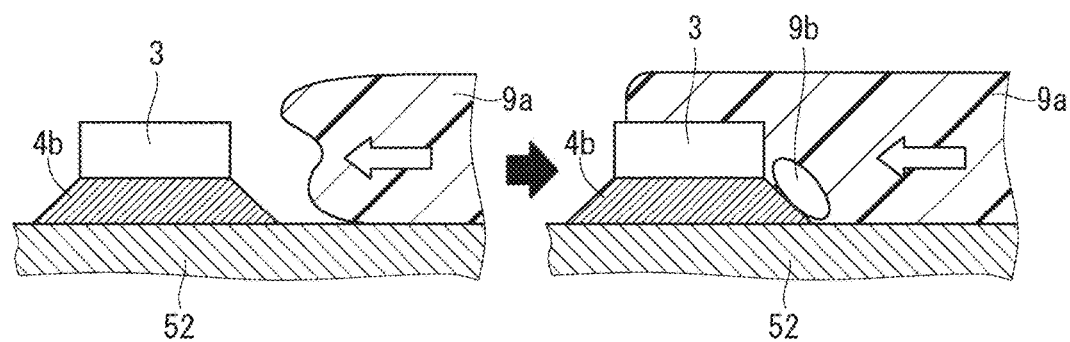

SEMICONDUCTOR DEVICE

BACKGROUND OF THE INVENTION

Field of the Invention

The present invention relates to semiconductor devices that are utilized in various apparatuses ranging from apparatuses for generation and transmission of power to apparatuses for efficient use and reproduction of energy.

Description of the Background Art

In a semiconductor device, thermal shrinkage of a sealing resin and a component sealed by the sealing resin results in detachment of the sealing resin from the components. To address this, proposed is a technique for high adhesion between the sealing resin and the component sealed with the sealing resin.

For instance, Japanese Patent Application Laid-Open No. 2004-186622 discloses a semiconductor device that includes a metal plate and a semiconductor element attached to the metal block. The metal block includes a plurality of square recesses arranged in X and Y directions at substantially regular intervals on a surface of the metal block, in a portion other than a region where the semiconductor element is mounted. Japanese Patent Application Laid-Open No. 2004-186622 describes a technique of improving a stop of flow of solder, thereby further improving the stability of the thickness of the solder, and achieving the adhesion between the metal block and the sealing resin. Herein, the X direction is a lateral direction in a horizontal direction; the Y direction, a longitudinal direction in a horizontal direction; and a Z direction, a vertical direction.

In the technique of Japanese Patent Application Laid-Open No. 2004-186622, an anchoring effect is exerted in the X and Y directions for preventing the detachment of the sealing resin, but is not exerted in the Z direction, in which the detachment needs to be prevented the most. Hence, the technique of Japanese Patent Application Laid-Open No. 2004-186622 has not improved the lifetime of the semiconductor device to a large extent.

SUMMARY

It is an object of the present invention to provide a technique of reducing detachment of a sealing resin in a semiconductor device, thereby achieving an increased improvement in lifetime of the semiconductor device.

A semiconductor device according to an aspect of the present invention includes the following: an insulating substrate; a metal block disposed on the upper surface of the insulating substrate; a semiconductor element mounted on the upper surface of the metal block; a case enclosing the semiconductor element, the metal block, and the insulating substrate; and a sealing resin sealing the semiconductor element and the metal block. The metal block includes at least one groove on a surface of the metal block, the surface being in contact with the sealing resin. The opening of the at least one groove has a width narrower than a width of the bottom surface of the at least one groove.

The groove is disposed on the surface of the metal block, the surface being in contact with the sealing resin. Such a configuration enables a large area in which the metal block is in contact with the sealing resin, thereby improving the adhesion between the metal block and the sealing resin. This reduces the detachment of the sealing resin. Further, the width of the opening of the groove is narrower than the width of the bottom surface of the groove. Such a configuration prevents the sealing resin, which is filled in the groove, from easy detachment, thereby further reducing the detachment of the sealing resin. This improves the lifetime of the semiconductor device to a large extent.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a cross-sectional view of a semiconductor device according to a first preferred embodiment;

FIG. 2 is a perspective view of a metal block;

FIG. 3 is a diagram illustrating the length of a wire in the metal block with or without slopes;

FIG. 4 is a diagram illustrating a flow of a resin in a metal block without grooves;

DESCRIPTION OF THE PREFERRED EMBODIMENTS

First Preferred Embodiment

Figure 5:
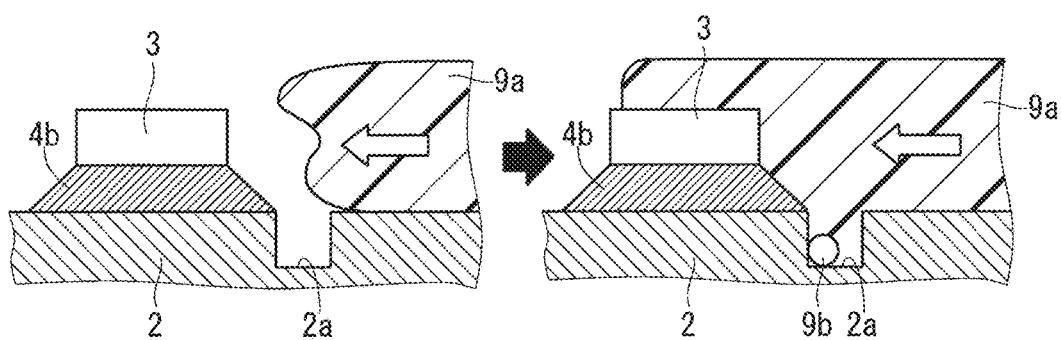
FIG. 5 is a diagram illustrating a flow of the resin in the metal block with grooves.

A first preferred embodiment of the invention will be described with reference to the drawings. FIG. 1 is a cross-sectional view of a semiconductor device according to the first preferred embodiment.

As illustrated in FIG. 1, the semiconductor device includes an insulating substrate 1, a metal block 2, a semiconductor element 3, a case 6, electrodes 7a and 7b, and a sealing resin 9.

The insulating substrate 1 includes a base plate 1a, an insulating sheet 1b, and circuit patterns 1c and 1d. The base plate 1a is made of metal such as copper and has high thermal conductivity. The insulating sheet 1b is disposed on the upper surface of the base plate 1a. The insulating sheet 1b is made of, for instance, an epoxy resin and has high insulation properties. The circuit patterns 1c and 1d are disposed on the upper surface of the insulating sheet 1b. The circuit patterns 1c and 1d are made of metal such as copper and have high thermal conductivity.

The metal block 2 is disposed on the upper surface of the circuit pattern 1d with a bonding material 4a interposed therebetween. The semiconductor element 3 is mounted on the upper surface of the metal block 2 with a bonding material 4b interposed therebetween. The semiconductor element 3 is made of Si, for instance. In some embodiments, the semiconductor element 3 is made of SiC or GaN, instead of Si.

The case 6 is made of resin, for instance. The insulating substrate 1 is attached to the case 6. The case 6 encloses the semiconductor element 3, the metal block 2, and the insulating substrate 1.

The electrodes 7a and 7b are for electrical connection to the outside of the semiconductor device. The electrodes 7a and 7b are attached to the case 6. The tip portions of the electrodes 7a and 7b are exposed from the case 6. The electrode 7a is connected to the circuit pattern 1c through a wire 8a. The semiconductor element 3 is connected to the circuit pattern 1c through a wire 8b. The electrode 7b is connected to the circuit pattern 1d through a wire 8c.

An example of the sealing resin 9 is an epoxy resin. The sealing resin 9 is filled inside the case 6, and seals the semiconductor element 3 and the metal block 2.

The details of the metal block 2 will be now described with reference to FIG. 2. FIG. 2 is a perspective view of the metal block 2.

As illustrated in FIG. 2, the metal block 2 is substantially rectangular-parallelepiped in shape, and has a rectangular shape in plan view. The metal block 2 has two grooves 2a and two slopes 2b. The two grooves 2a are disposed on a surface of the metal block 2, the surface being in contact with the sealing resin 9. More specifically, the two grooves 2a are disposed on the upper surface serving as a mounting surface of the metal block 2 on which the semiconductor element 3 is mounted. The two grooves 2a are individually disposed at the right and left end portions of the metal block 2, and each extend through from the front side surface of the metal block 2 to the opposite, rear side surface of the metal block 2.

The two slopes 2b are disposed in upper portions of two of the four side surfaces of the metal block 2, and are each formed to have an inclined shape inclined toward the opposite side-surface side of the metal block 2. More specifically, the two slopes 2b are disposed in upper portions at the right and left end portions of the metal block 2, and are each inclined so as to further approach the opposite side of the metal block 2 as the slope 2b approaches the upper-end-portion side of the metal block 2.

The two slopes 2b are adjacent to the two grooves 2a. More specifically, the two slopes 2b each form an outer side wall of the groove 2a, in the direction of the width of the groove 2a. The two slopes 2b are each formed to be inclined toward the opposite side of the metal block 2 by bending each of the upper portions at the right and left end portions of the metal block 2 toward the opposite side along the groove 2a.

The two slopes 2b are adjacent to the two grooves 2a. Accordingly, the opening of each groove 2a has a width W1 narrower than a width W2 of the bottom surface of the groove 2a. The metal block 2 with the grooves 2a has a larger area in which the metal block 2 is in contact with the sealing resin 9, than the metal block 2 without the grooves 2a. In addition, as illustrated in FIG. 2, each groove 2a is configured such that the width W1 of the opening of the groove 2a is narrower than the width W2 of the bottom surface of the groove 2a. Such a configuration achieves an anchoring effect when the sealing resin 9 is about to detach from the metal block 2 during thermal shrinkage of the sealing resin 9 and the metal block 2.

With reference to FIG. 3, the following now describes the length of the wire 8b in the metal block 2 with or without the slopes 2b. FIG. 3 is a diagram illustrating the length of the wire 8b in the metal block 2 with or without the slopes 2b. A solid line denotes the wire 8b in the presence of the slopes 2b; and a dotted line denotes the wire 8b in the absence of the slopes 2b.

To maintain insulation properties, a given distance is required between the wire 8b and the metal block 2 as illustrated in FIG. 3. In the absence of the slopes 2b, the wire 8b needs to be spaced apart from a corner in an upper portion of the metal block 2 by a given distance. In contrast, in the presence of the slopes 2b, the wire 8b only needs to be spaced apart from the slopes 2b by a given distance as described above. Consequently, the wire 8b is shorter in the presence of the slopes 2b than in the absence of the slopes 2b. This reduces the cost of manufacturing the semiconductor device.

The following now describes a reduction in void that is generated in the manufacture of the semiconductor device. FIG. 4 is a diagram illustrating a flow of a resin 9a in a metal block 52 without grooves. FIG. 5 is a diagram illustrating a flow of the resin 9a in the metal block 2 with the grooves 2a. The resin 9a is a not-yet-cured sealing resin 9.

Described is the flow of the resin 9a in the metal block 52 without the grooves. As illustrated in FIG. 4, the resin 9a, upon being poured, flows toward the semiconductor element 3 above the metal block 52. Air goes into the resin 9a during the poring of the resin 9a, and the air moves together with the resin 9a. Here, the semiconductor element 3 and the bonding material 4b, both of which are on a way of the flowing resin 9a, obstruct the flow of the resin 9a. As a result, a void is likely to remain near the bonding material 4b. The sealing resin 9 (cf. FIG. 1) is likely to inherently detach from the bonding material 4b. Hence, a void 9b near the bonding material 4b causes the sealing resin 9 to detach from the bonding material 4b more rapidly than usual. This affects the lifetime of the semiconductor device.

Reference is made to the technique of Japanese Patent Application Laid-Open No. 2004-186622. When a resin flows into the square recesses in the manufacture of the semiconductor device, air can move out nowhere, and thus remains in the square recesses as voids. As a result, different semiconductor devices have different lifetimes. In addition, these semiconductor devices have a shorter lifetime than assumed.

In contrast to this, the void 9b remains in each groove 2a, in the metal block 2 with the grooves 2a, that is, in the presence of the grooves 2a adjacent to the semiconductor element 3 and the bonding material 4b, as illustrated in FIG. 5. Hence, the void 9b remaining near the bonding material 4b is reduced. This improves the lifetime of the semiconductor device to a large extent.

Figure 6:
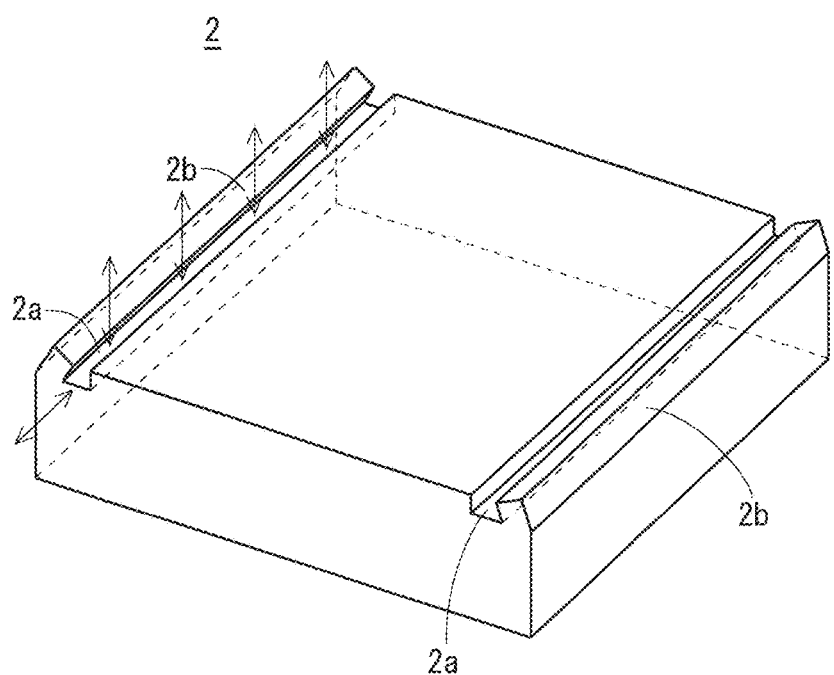
FIG. 6 is another perspective view of the metal block.

As illustrated in FIG. 6, the grooves 2a extend across two or more surfaces of the metal block 2; more specifically, the grooves 2a extend across the front side surface of the metal block 2, the upper surface serving as a mounting surface of the metal block 2 on which the semiconductor element 3 is mounted, and the rear side surface of the metal block 2. In other words, the grooves 2a extend through from the front side surface of the metal block 2 to the opposite, rear side surface of the metal block 2. Accordingly, the resin 9a easily flows through the grooves 2a, and air easily escapes from the grooves 2a to the outside of the metal block 2. This reduces the void 9b. FIG. 6 is another perspective view of the metal block 2.

Figure 7:
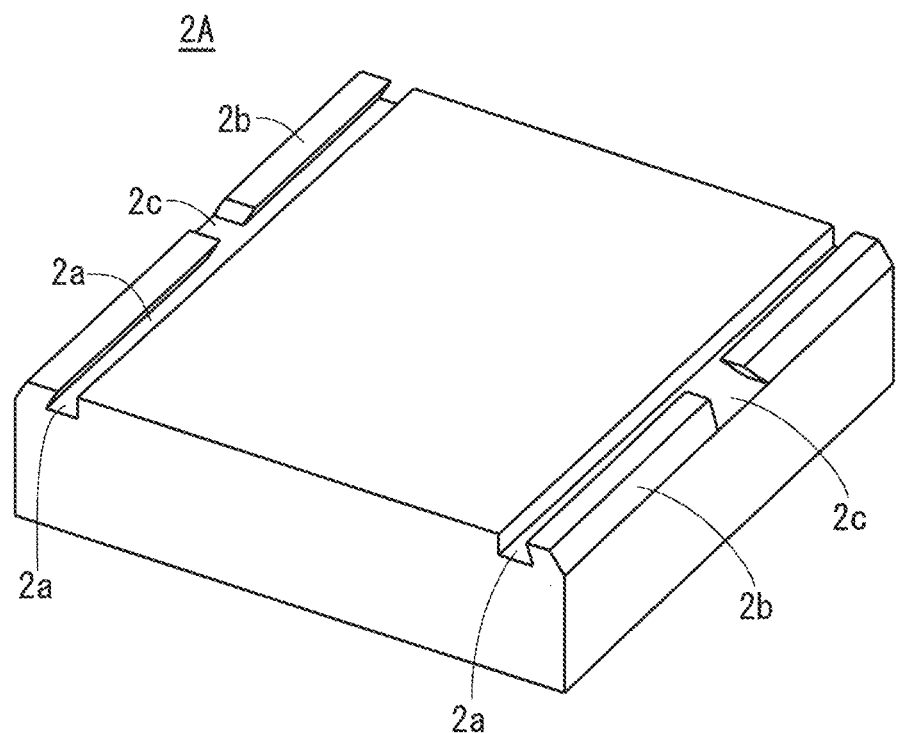
FIG. 7 is a perspective view of a metal block of a semiconductor device according to a first modification of the first preferred embodiment.
Figure 8:
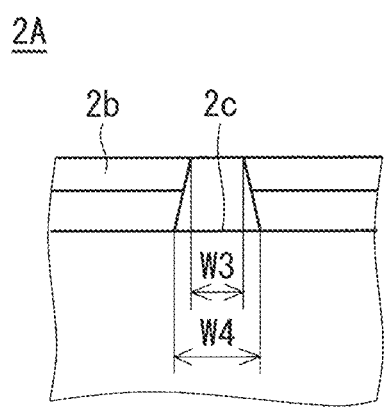
FIG. 8 is an enlarged view of each groove.

The following now describes a modification of the first preferred embodiment. FIG. 7 is a perspective view of a metal block 2A of a semiconductor device according to a first modification of the first preferred embodiment. FIG. 8 is an enlarged view of each groove 2c.

As illustrated in FIGS. 7 and 8, the metal block 2A includes two grooves 2c each disposed in the middle portion of the slope 2b, in a fore-and-aft direction of the slope 2b, the two grooves 2c each extending in a vertical direction. The two grooves 2c are longitudinal grooves extending downward along the right and left side surfaces of the metal block 2A, from a mounting surface of the metal block 2A on which the semiconductor element 3 is mounted. As illustrated in FIG. 8, the opening of each groove 2c has a width W3 narrower than a width W4 of the bottom surface of the groove 2c.

The additional grooves 2c produce paths through which air moves out. Consequently, the metal block 2A in FIGS. 7 and 8 further reduces the void than the metal block 2 in FIGS. 2 and 6. The additional grooves 2c enables the metal block 2A in FIGS. 7 and 8 to have a larger area in which the metal block 2A is in contact with the sealing resin 9, than the metal block 2 in FIGS. 2 and 6. Moreover, the grooves 2c achieve the anchoring effect.

The metal block 2A may include any numbers of grooves 2a other than two grooves. The groove 2a may be disposed in only either of the right and left end portions of the metal block 2A. Moreover, the groove 2a may be disposed at either of the front and rear end portions of the metal block 2A or at both end portions. Further, the metal block 2A may include any numbers of slopes 2b other than two slopes. The slope 2b is required to be disposed in an upper portion of at least one of the four side surfaces of the metal block 2A.

Figure 9:
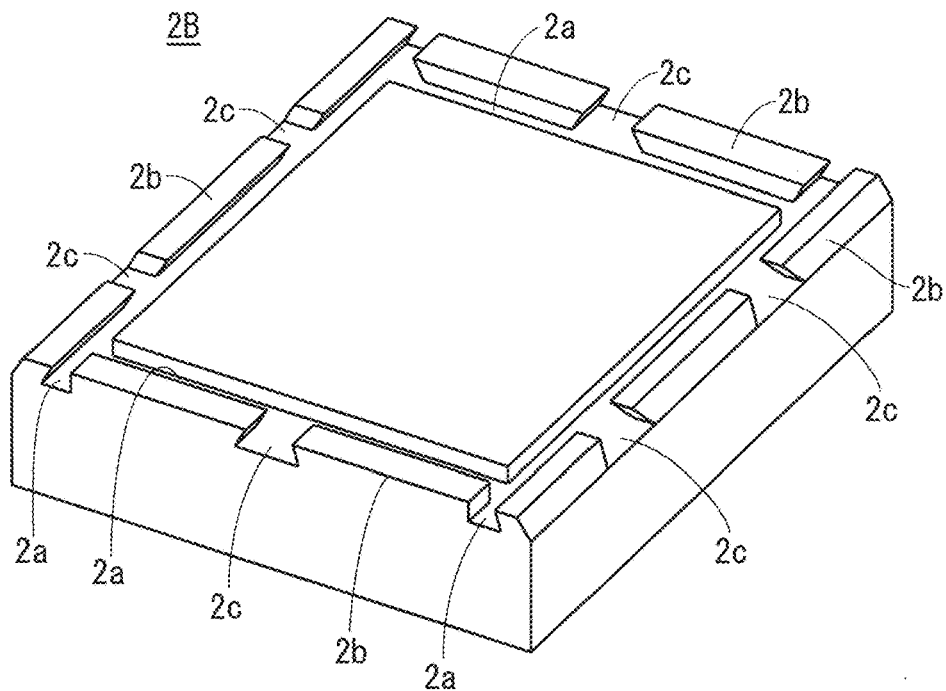
FIG. 9 is a perspective view of a metal block of a semiconductor device according to a second modification of the first preferred embodiment.
Figure 10:
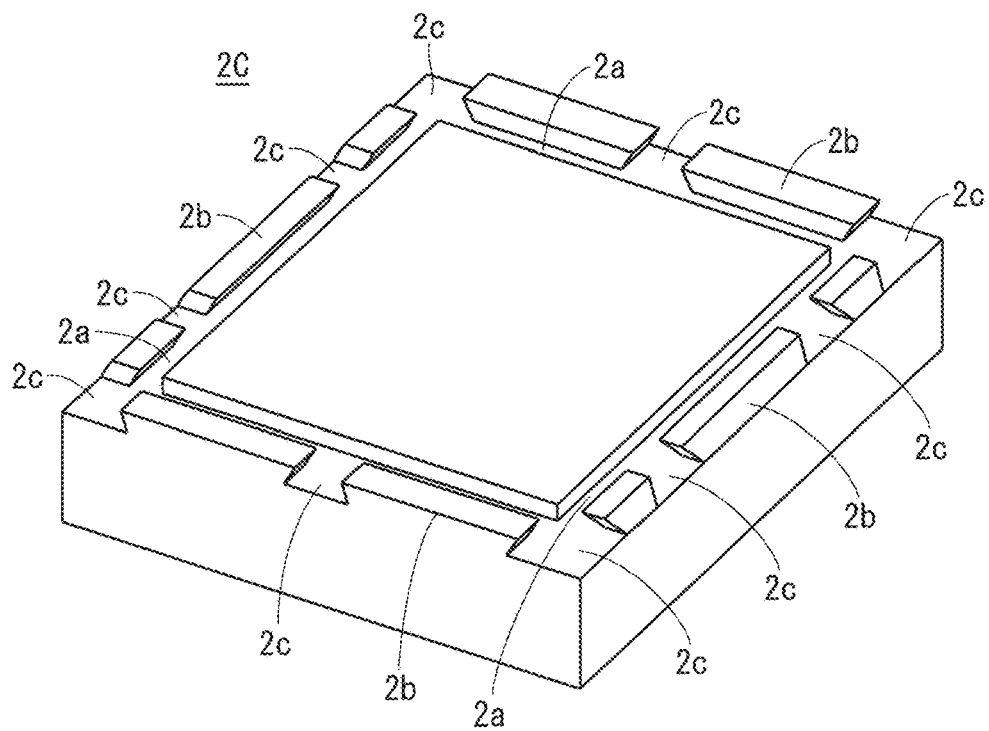
FIG. 10 is a perspective view of a metal block of a semiconductor device according to a third modification of the first preferred embodiment.

With reference to FIGS. 9 and 10, the following describes an example in which four grooves 2a are individually disposed in the right, left, front, and rear end portions of a metal block, and in which four slopes 2b are individually disposed on the four side surfaces of the metal block. FIG. 9 is a perspective view of a metal block 2B of a semiconductor device according to a second modification of the first preferred embodiment. FIG. 10 is a perspective view of a metal block 2C of a semiconductor device according to a third modification of the first preferred embodiment.

As illustrated in FIG. 9, the four grooves 2a are individually disposed at the right, left, front, and rear end portions of the metal block 2B; and the four slopes 2b are individually disposed on the four side surfaces of the metal block 2B. Two of the grooves 2a, extending in a right-and-left direction of the metal block 2B, and two of the grooves 2a, extending in a fore-and-aft direction of the metal block 2B, are orthogonal to each other. The two grooves 2a, extending in the fore-and-aft direction, are each extend through from the front side surface of the metal block 2B to the opposite, rear side surface of the metal block 2B. The two grooves 2a, extending in the right-and-left direction, are each disposed between the right and left slopes 2b, and each do not extend through from the left side surface of the metal block 2B to the opposite, right side surface of the metal block 2B.

The grooves 2c are disposed in the middle portions of the slopes 2b on the front and rear side surfaces, in a right-and-left direction of the slopes 2b, and are disposed in the front portions and rear portions of the slopes 2b on the right and left side surfaces. The metal block 2B in FIG. 9, which includes more grooves 2a and more grooves 2c, further reduces the void and has a larger area in which the metal block 2B is in contact with the sealing resin 9, than the metal block 2A in FIG. 7. Moreover, the slopes 2b achieve the anchoring effect. If the semiconductor element 3 and the metal block 2B have enough dimensions, the shape of the metal block 2B can be selected.

The grooves 2a, when disposed at the right, left, front, and rear end portions of the metal block 2B, each preferably extend through in only a single direction, as illustrated in FIG. 9, in view of the strength of the corner portions of the metal block 2B and of easy production of the metal block 2B. Alternatively, the four corners of the metal block 2C are each preferably processed into a predetermined shape, as illustrated in FIG. 10. Specifically, it is preferable that the four corner portions of the metal block 2C be removed in advance and then the grooves 2c be disposed at the four corner portions as removed.

As described above, the semiconductor device according to the first preferred embodiment is configured such that the grooves 2a are disposed on the surface of each of the metal blocks 2, 2A, 2B, and 2C, the surface being in contact with the sealing resin 9. Such a configuration enables a large area in which each of the metal blocks 2, 2A, 2B, and 2C is in contact with the sealing resin 9, thereby improving the adhesion between each of the metal the block 2, 2A, 2B, and 2C, and the sealing resin 9. This reduces the detachment of the sealing resin 9. Further, the semiconductor device is configured such that the width W1 of the opening of each groove 2a is narrower than the width W2 of the bottom surface of the groove 2a. Such a configuration prevents the sealing resin 9, which is filled in the groove 2a, from easy detachment, thereby further reducing the detachment of the sealing resin 9. This improves the lifetime of the semiconductor device to a large extent.

The grooves 2a are disposed on the mounting surface of each of the metal blocks 2, 2A, 2B, and 2C, on which the semiconductor element 3 is mounted. A high thermal stress is applied around the semiconductor element 3; and thus the sealing resin 9 is likely to detach around the semiconductor element 3. To address this, the grooves 2a are disposed on the mounting surface of the metal block, on which the semiconductor element 3 is mounted; that is, the grooves 2a are disposed around the semiconductor element 3. This effectively reduces the detachment of the sealing resin 9.

The metal blocks 2, 2A, 2B, and 2C each have a rectangular shape in plan view. Further, at least one of the four side surfaces of each of the metal blocks 2, 2A, 2B, and 2C has a top portion having an inclined shape inclined toward the opposite side-surface side of the metal block. Accordingly, the wire 8b, which needs to be spaced apart from the slope 2b by a given distance, is shorter in the presence of the slopes 2b than in the absence of the slopes 2b. This reduces the cost of manufacturing the semiconductor device.

The grooves 2a each extend through from the side surfaces of the metal blocks 2B and 2C to the opposite side surfaces of the metal blocks 2B and 2C. Accordingly, the resin 9a easily flows through the grooves 2a; and air easily escapes from the grooves 2a to the outside of the metal blocks 2B and 2C. This reduces the void 9b.

The groove 2a includes a plurality of grooves. Two of the grooves 2a are orthogonal to each other. One of the two grooves 2a extends through from the side surface of the metal block 2B to the opposite side surface of the metal block 2B. The other of the two grooves 2a does not extend through from the side-surface side of metal block 2B to the opposite side-surface side of the metal block 2B. Let both grooves, orthogonal to each other, extend through from the side surface of the metal block 2B to the opposite side surface the metal block 2B. Such a configuration results in a thin thickness of the metal block 2B, and the strength of the metal block 2B can be reduced. Accordingly, avoiding this configuration enables the metal block 2B to be produced in a stable manner.

The semiconductor element 3 is made of Si, SiC, or GaN. Accordingly, the semiconductor device can include various semiconductor elements. Let the semiconductor element 3 be made of SiC. The SiC semiconductor element results in a wider temperature range within which the semiconductor device operates, and a further increase in thermal stress, than a conventional semiconductor device. Consequently, the sealing resin 9 is likely to detach. However, the above-described configuration effectively reduces the detachment of the sealing resin 9.

Second Preferred Embodiment

Figure 11:
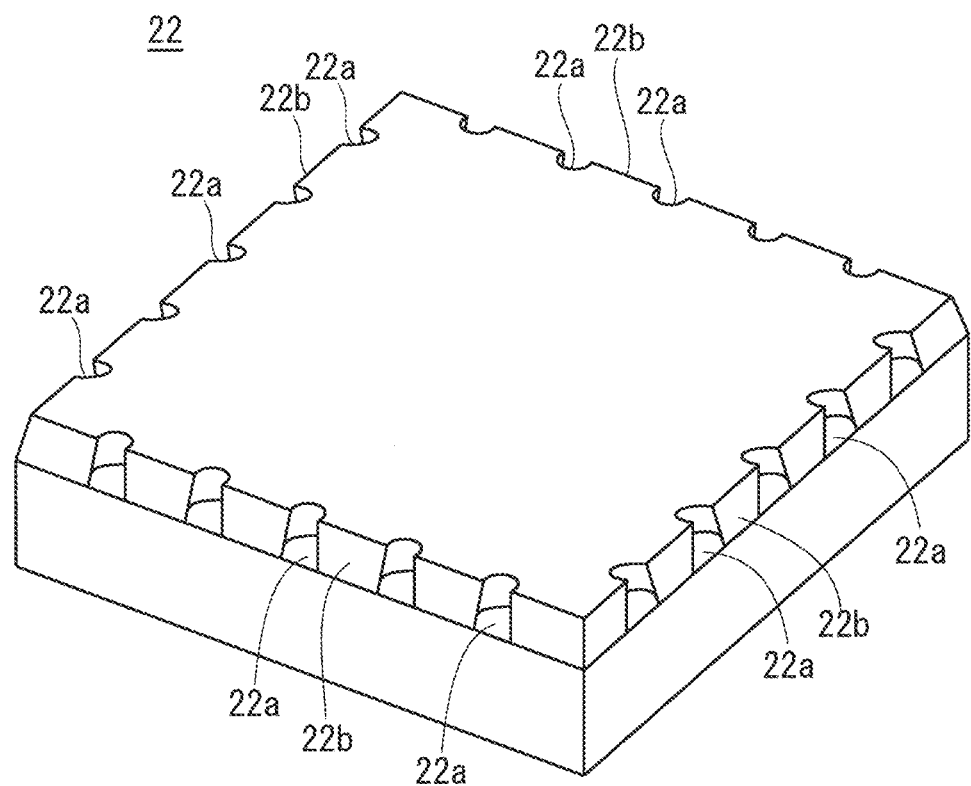
FIG. 11 is a perspective view of a metal block of a semiconductor device according to a second preferred embodiment.
Figure 12:
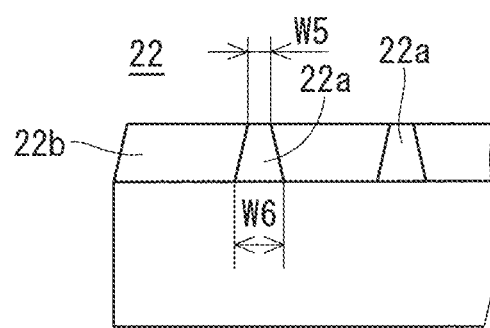
FIG. 12 is an enlarged view of each groove.

The following describes a semiconductor device according to a second preferred embodiment. FIG. 11 is a perspective view of a metal block 22 of the semiconductor device according to the second preferred embodiment. FIG. 12 is an enlarged view of each groove 22a. In the second preferred embodiment, the same components as those described in the first preferred embodiment are denoted by the same symbols. The description of the same components is thus omitted.

The second preferred embodiment describes an example in which the metal block does not have a sufficient thickness for the above-mentioned processing. As illustrated in FIGS. 11 and 12, the metal block 22 is substantially rectangular-parallelepiped in shape, and has a rectangular shape in plan view. The metal block 22 includes a plurality of grooves 22a and four slopes 22b.

The four slopes 22b are individually disposed in upper portions of the four side surfaces of the metal block 22, and each have an inclined shape inclined toward the opposite side-surface side of the metal block 22. More specifically, the four slopes 22b are individually disposed in upper portions at the front, rear, right, and left end portions of the metal block 22. The front and rear slopes 22b are each inclined so as to further approach the opposite side of the metal block 22 as the slope 22b approaches the upper-end-portion side of the metal block 22. The right and left slopes 22b are each inclined so as to further approach the opposite side of the metal block 22 as the slope 22b approaches the upper-end-portion side of the metal block 22.

These grooves 22a are disposed on a surface of the metal block 22, the surface being in contact with the sealing resin 9. More specifically, the grooves 22a are disposed on the upper surface serving as a mounting surface of the metal block 22 on which the semiconductor element 3 is mounted. These grooves 22a are longitudinal grooves extending downward along the front, rear, right, or left side surfaces of the metal block 22, from the mounting surface of the metal block 22, on which the semiconductor element 3 is mounted.

As illustrated in FIG. 12, each groove 22a has a trapezoidal shape in cross-sectional view; and the upper base of the trapezoidal shape of the groove 22a has a length W5 shorter than a length W6 of the lower base of the trapezoidal shape of the groove 22a. The metal block 22 with the grooves 22a has a larger area in which the metal block 22 is in contact with the sealing resin 9, than a metal block without the grooves 22a. Moreover, the length W5 of the upper base of the trapezoidal shape of the groove 22a is shorter than the length W6 of the lower base of the trapezoidal shape of the groove 22a. This achieves an anchoring effect when the sealing resin 9 is about to detach from the metal block 22 during thermal shrinkage of the sealing resin 9 and the metal block 22. Further, by virtue of the slopes 22b, the wire 8b is shorter in the presence of the slopes 22b than in the absence of the slopes 22b. This reduces the cost of manufacturing the semiconductor device.

As described above, the semiconductor device according to the second preferred embodiment is configured such that the grooves 22a are longitudinal grooves extending downward along the side surfaces of the metal block 22, from the surface of the metal block 22, above which the semiconductor element 3 is mounted. Further, each groove 22a has a trapezoidal shape in cross-sectional view. Still further, the length of the upper base of the trapezoidal shape of the groove 22a is shorter than the length of the lower base of the trapezoidal shape of the groove 22a.

Consequently, in a case where the metal block 22 is thin or grooves extending in a horizontal direction are difficult to be formed because the outer diameter of the semiconductor element 3 has a dimension approximate to that of the outer diameter of the metal block 22, such a configuration enables the metal block 22 to have a shape that achieves the anchoring effect in less space.

Third Preferred Embodiment

Figure 13:
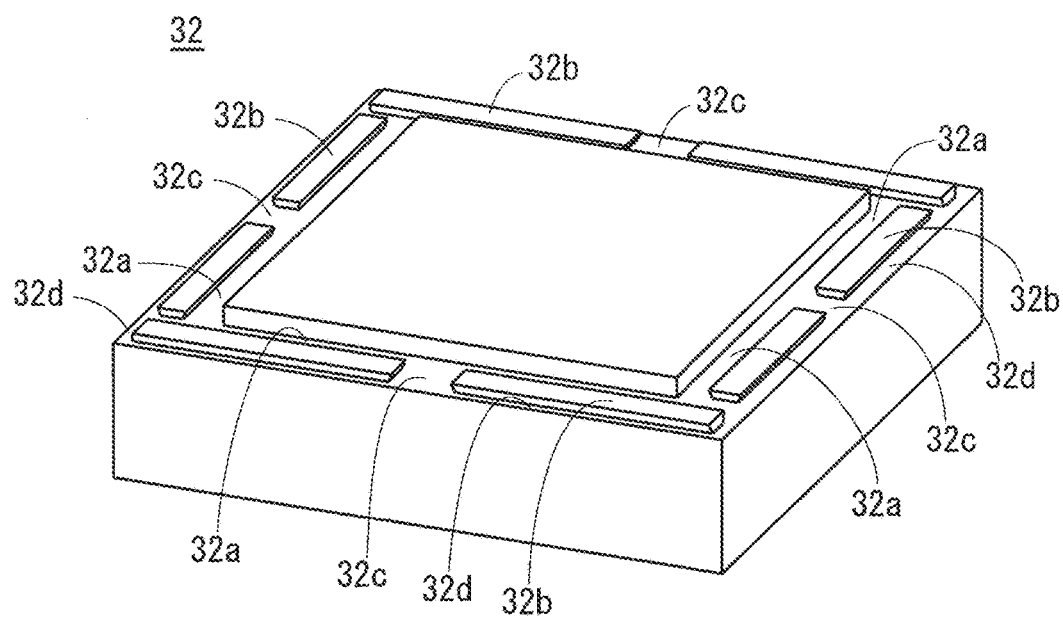
FIG. 13 is a perspective view of a metal block of a semiconductor device according to a third preferred embodiment.
Figure 14:
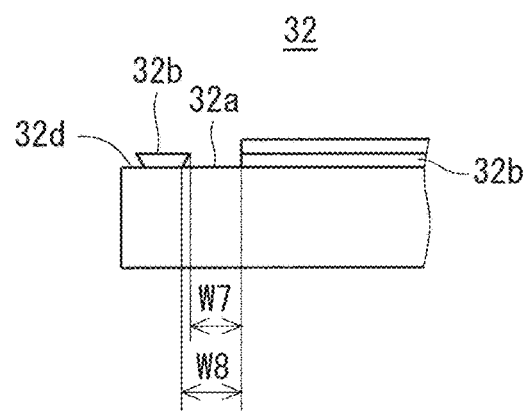
FIG. 14 is an enlarged view of each groove.

The following describes a semiconductor device according to a third preferred embodiment. FIG. 13 is a perspective view of a metal block 32 of the semiconductor device according to the third preferred embodiment. FIG. 14 is an enlarged view of each groove 32a. In the third preferred embodiment, the same components as those described in the first preferred embodiment are denoted by the same symbols. The description of the same components is thus omitted.

The third preferred embodiment describes an example in which each side of the metal block 32 has two anchors in order to improve the adhesion between the sealing resin 9 and the metal block 32. As illustrated in FIGS. 13 and 14, the metal block 32 is substantially rectangular-parallelepiped in shape, and has a rectangular shape in plan view. The metal block 32 includes four grooves 32a, four trapezoids 32b, four grooves 32c, and four gaps 32d.

The upper base of each trapezoid 32b has a length longer than a length of the lower base of the trapezoid 32b. Each trapezoid 32b is more adjacent to a surface side of the metal block 32, on which the semiconductor element 3 is mounted, than the periphery at the upper end portion of the metal block 32. The side surfaces of each trapezoid 32b are each inclined so as to further approach the opposite side-surface side of the trapezoid 32b as the side surface approaches the lower-end-portion side of the trapezoid 32b Each groove 32a is disposed between the mounting surface of the metal block 32, on which the semiconductor element 3 is mounted, and the trapezoid 32b.

The grooves 32a extending in a right-and-left direction of the metal block 32 and the grooves 32a extending in a fore-and-aft direction of the metal block 32 are orthogonal to each other. The grooves 32a, extending in the right-and-left direction, each extend through from the side surface of the metal block 32 to the opposite side surface of the metal block 32. The grooves 32a, extending in the fore-and-aft direction, each do not extend through from the side-surface side of the metal block 32 to the opposite side-surface side of the metal block 32.

Each groove 32c is disposed in the middle portion of the trapezoid 32b. Each gap 32d is disposed between the periphery at the upper end portion of the metal block 32 and the trapezoid 32b.

As illustrated in FIG. 14, the opening of each groove 32*a* has a width W7 narrower than a width W8 of the bottom surface of the groove 32*a*. Further, a height position of the trapezoid 32*b* is lower than a height position of the mounting surface of the metal block 32, on which the semiconductor element 3 is mounted. Such a configuration enables the wire 8*b* to be short. This reduces the cost of manufacturing the semiconductor device.

As described above, the semiconductor device according to the third preferred embodiment is configured such that each side of the metal block 32 has two anchors: the groove 32*a* extending along the side of the metal block 32; and the gap 32*d*. This further improves the adhesion between the sealing resin 9 and the metal block 32.

It is to be noted that in the present invention, the individual preferred embodiments can be freely combined, or can be modified and omitted as appropriate, within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
    an insulating substrate;
    a one-piece metal block disposed on an upper surface of said insulating substrate;
    a semiconductor element mounted on an upper surface of said metal block;
    a case enclosing said semiconductor element, said metal block, and said insulating substrate; and
    a sealing resin sealing said semiconductor element and said metal block,
    wherein said metal block comprises at least one groove on a surface of said metal block, said surface being in contact with said sealing resin, and
    wherein an opening of said at least one groove has a width narrower than a width of a bottom surface of said at least one groove.

2. The semiconductor device according to claim 1, wherein said at least one groove is disposed on a mounting surface of said metal block on which said semiconductor element is mounted.

3. The semiconductor device according to claim 1,
    wherein said metal block has a rectangular shape in plan view, and
    wherein at least one of four side surfaces of said metal block comprises an upper portion having an inclined shape inclined toward an opposite side-surface side of said metal block.

4. The semiconductor device according to claim 2,
    wherein said at least one groove is a longitudinal groove extending downward along a side surface of said metal block, from said mounting surface of said metal block, on which said semiconductor element is mounted,
    wherein said at least one groove has a trapezoidal shape in cross-sectional view, and
    wherein an upper base of said trapezoidal shape of said at least one groove has a length shorter than a length of a lower base of said trapezoidal shape of said at least one groove.

5. The semiconductor device according to claim 1, wherein said at least one groove extends through from a side surface of said metal block to an opposite side surface of said metal block.

6. The semiconductor device according to claim 5,
    wherein said at least one groove comprises a plurality of grooves,
    wherein two of said plurality of grooves are orthogonal to each other, and
    wherein one of said two grooves extends through from a side surface of said metal block to an opposite side surface of said metal block, and the other of said two grooves does not extend through from a side-surface side of said metal block to an opposite side-surface side of said metal block.

7. The semiconductor device according to claim 1, wherein said semiconductor element is made of Si, SiC, or GaN.

* * * * *